United States Patent
Yoneda

(10) Patent No.: US 11,621,552 B2
(45) Date of Patent: *Apr. 4, 2023

(54) PROTECTION CIRCUIT AND PHOTOVOLTAIC SYSTEM

(71) Applicant: DEXERIALS CORPORATION, Tokyo (JP)

(72) Inventor: Yoshihiro Yoneda, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/678,682

(22) Filed: Feb. 23, 2022

(65) Prior Publication Data

US 2022/0181870 A1   Jun. 9, 2022

Related U.S. Application Data

(63) Continuation of application No. 16/971,462, filed as application No. PCT/JP2019/002544 on Jan. 25, 2019, now Pat. No. 11,296,496.

(30) Foreign Application Priority Data

Feb. 27, 2018 (JP) ................... 2018-033574

(51) Int. Cl.
```
H02H 7/00       (2006.01)
H02H 7/20       (2006.01)
H02S 20/23      (2014.01)
H02S 40/34      (2014.01)
H02H 1/00       (2006.01)
```
(52) U.S. Cl.
CPC ............ *H02H 7/20* (2013.01); *H02H 1/0007* (2013.01); *H02S 20/23* (2014.12); *H02S 40/34* (2014.12)

(58) Field of Classification Search
None
See application file for complete search history.

(56) References Cited

U.S. PATENT DOCUMENTS

| 8,665,575 | B2 * | 3/2014 | Clevenger | H02H 7/20 |
|---|---|---|---|---|
| | | | | 361/103 |
| 11,296,496 | B2 * | 4/2022 | Yoneda | H02S 20/23 |
| 2017/0330715 | A1 | 11/2017 | von zur Muehlen et al. | |

FOREIGN PATENT DOCUMENTS

| JP | H11-040838 A | 2/1999 |
|---|---|---|
| JP | 2006-216660 A | 8/2006 |

(Continued)

OTHER PUBLICATIONS

Oct. 5, 2021, Japanese Office Action issued for related JP application No. 2018-033574.

(Continued)

*Primary Examiner* — Stephen W Jackson
(74) *Attorney, Agent, or Firm* — Paratus Law Group, PLLC

(57) ABSTRACT

Provided are a protection circuit and a photovoltaic system capable of irreversibly interrupting a current path of photovoltaic units such as solar cells by a signal in an emergency such as a fire. The protection circuit includes: a photovoltaic units 26, a protection element 2 provided on a current path of the photovoltaic units 26, and a switch 3 for activating the protection element 2, wherein the protection element 2 irreversibly interrupts the current path of the photovoltaic units 26.

19 Claims, 14 Drawing Sheets

(56) References Cited

FOREIGN PATENT DOCUMENTS

| JP | 2009-117188 A | 5/2009 |
|----|---------------|--------|
| JP | 2015-126009 A | 7/2015 |
| JP | 2015-138875 A | 7/2015 |
| JP | 2016-158400 A | 9/2016 |
| JP | 2017-073288 A | 4/2017 |
| KR | 10-2015-0053662 A | 5/2015 |

OTHER PUBLICATIONS

Dec. 28, 2021, Chinese Office Action issued for related CN Application No. 201980012180.6.

May 18, 2022, Korean Office Action issued for related KR Application No. 10-2020-7022548.

Nov. 28, 2022, Korean Office Action issued for related KR Application No. 10-2020-7022548.

\* cited by examiner

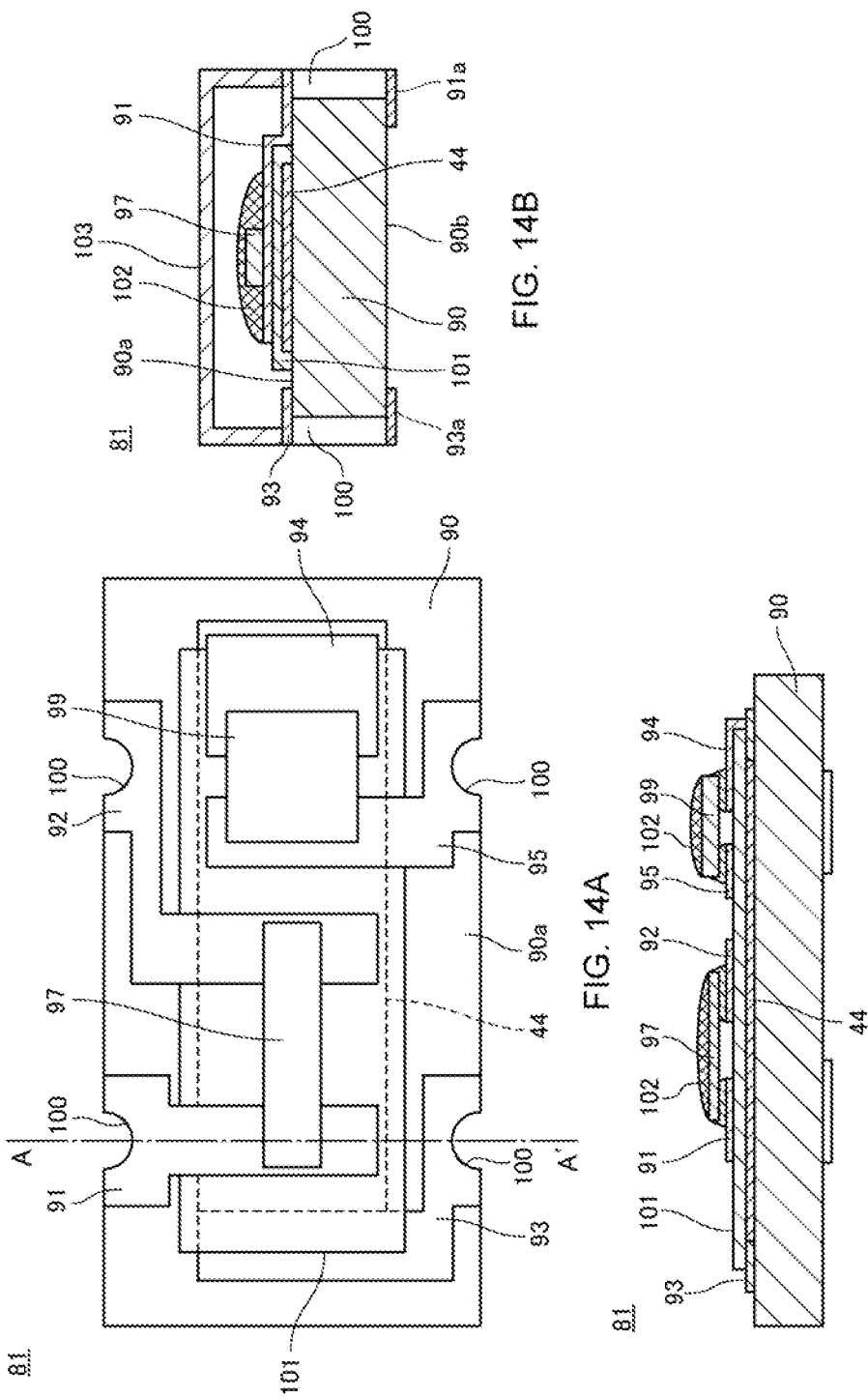

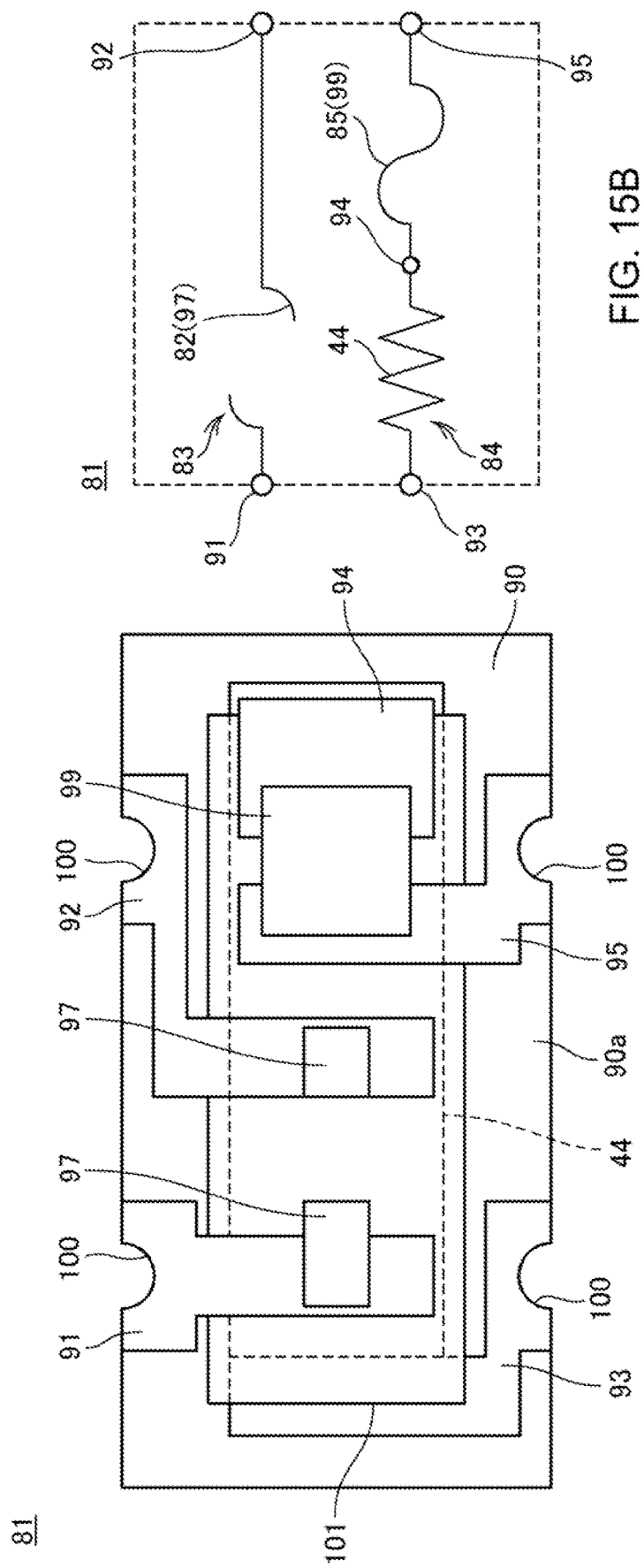
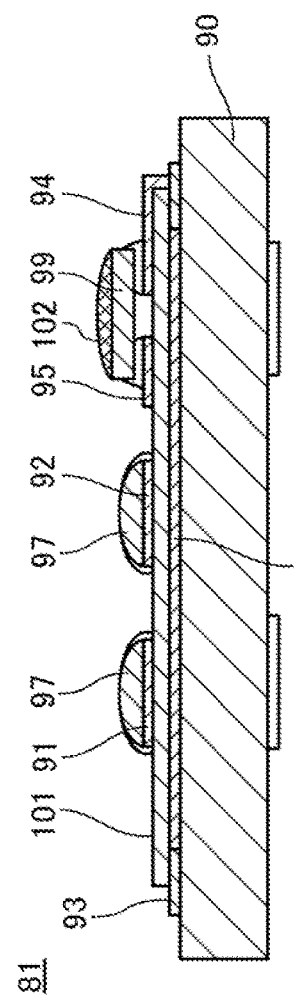
FIG. 15A
FIG. 15B
FIG. 15C

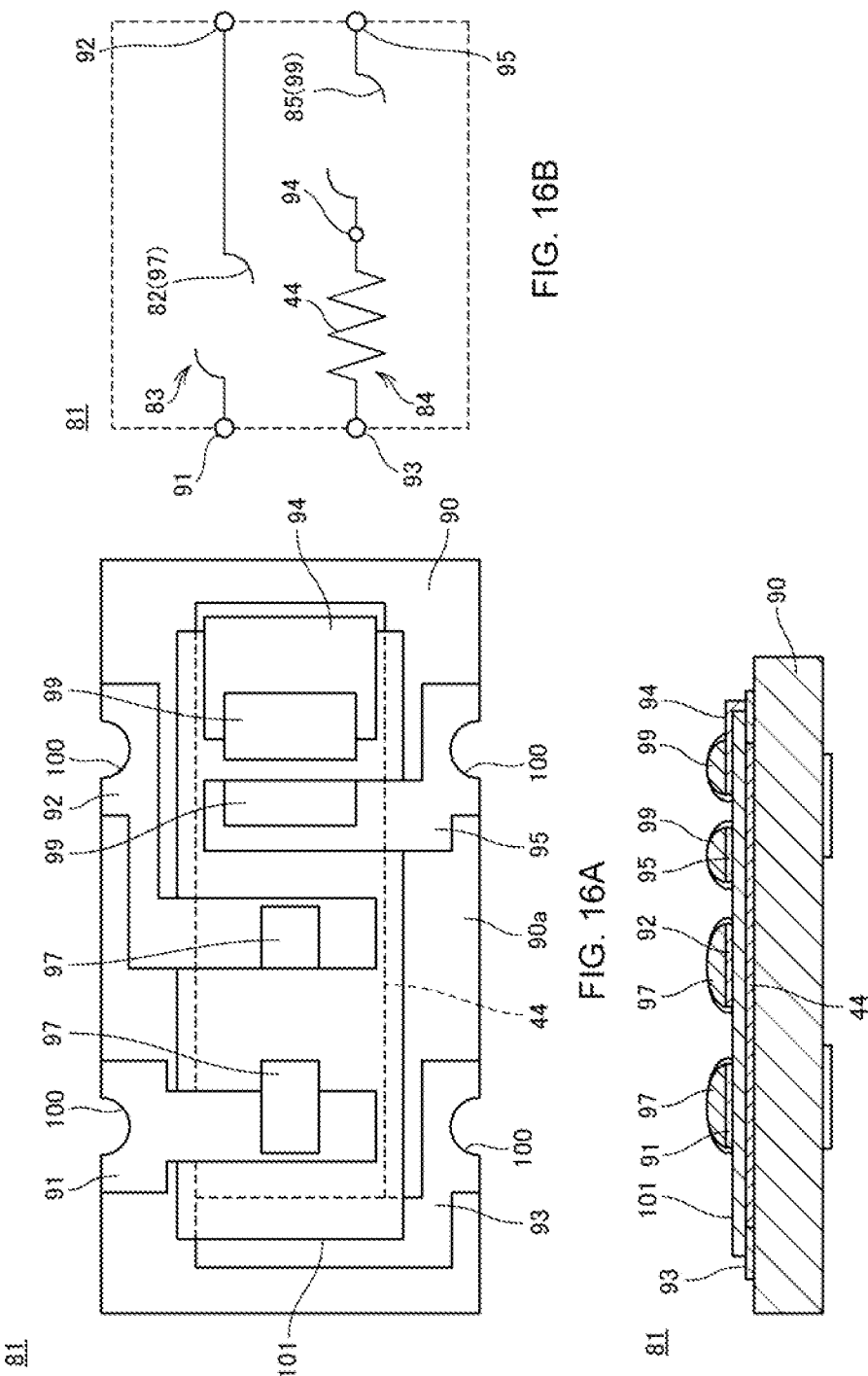

PROTECTION CIRCUIT AND PHOTOVOLTAIC SYSTEM

CROSS REFERENCE TO PRIOR APPLICATION

This application is a continuation of U.S. patent application Ser. No. 16/971,462 (filed on Aug. 20, 2020), which is a National Stage Patent Application of PCT International Patent Application No. PCT/JP2019/002544 (filed on Jan. 25, 2019) under 35 U.S.C. § 371, which claims priority to Japanese Patent Application No. 2018-033574 (filed on Feb. 27, 2018), which are all hereby incorporated by reference in their entirety.

TECHNICAL FIELD

This technology relates to a protection circuit which is suitably used in a solar photovoltaic system for generating electric power by photoelectrically converting sunlight.

BACKGROUND ART

Currently, solar photovoltaic systems have been rapidly spreading. A solar photovoltaic system obtains high voltage and large current by connecting a plurality of solar cells in series and in parallel. Since the solar photovoltaic system is an electric power device, there is a risk of fire breakout as with household electrical appliances, and the discharge energy is large because the voltage of the photovoltaic system is, for example, 300V DC, which is higher than that of commercial power supply. Therefore, it is considered that there is a high possibility of fire breakout in the event of fire or accident.

In the event of a fire in a building equipped with a solar photovoltaic system, fire extinguishing activities will be carried out after interrupting the current path leading to the building. However, since solar photovoltaic systems are also power generators, in cases of a fire or a fire breakout, they continue to supply power through sunlight or flames. Furthermore, in the event of a fire, the coating of the power transmission cable may melt and expose the wires. For this reason, there is a risk that firefighters may be electrocuted, and there is a possibility of a fire breaking out again due to electric discharge.

In general, a photovoltaic system achieves a large output by connecting a plurality of solar cell modules in series to form a string and connecting a plurality of strings in parallel. In view of this, a technology has been proposed in which a thermal fuse is inserted into each solar cell module so as to separate the modules by heat in a fire,
thereby avoiding generation of a large amount of electric power (see Patent reference 1 and Patent reference 2).

However, in the case of a half-burned state, since all the solar cell modules are not separated, there is a risk that a large amount of electric power is generated in a portion where the connection remains. In addition, if a bimetal is used in place of the thermal fuse, the connection between the solar cell modules is restored when the temperature after extinguishing the fire drops, and there is a risk of generating a large amount of electric power.

PRIOR ART REFERENCE

Patent Reference

Patent reference 1: Japanese Unexamined Patent Application Publication No. 11-40838
Patent reference 2: Japanese Unexamined Patent Application Publication No. 2015-138875

SUMMARY OF THE INVENTION

Problem to be Solved by the Invention

An object of the present technology is to provide a protection circuit and a photovoltaic system capable of irreversibly interrupting a current path of photovoltaic units such as solar cells by a signal in an emergency such as a fire.

Means of Solving the Problem

In order to solve the above problems, a protection circuit according to the present technology includes: a plurality of electrically connected photovoltaic units; a protection element provided on a current path between the plurality of photovoltaic units; and a switch for activating the protection element; wherein the protection element irreversibly interrupts the current path of the photovoltaic units.

The photovoltaic system according to the present technology includes: a plurality of electrically connected photovoltaic units; a protection element provided on a current path between the plurality of photovoltaic units; and a switch for activating the protection element; wherein the protection element irreversibly interrupts the current path of the photovoltaic units.

Effects of the Invention

According to this technology, by providing a protection circuit for irreversibly interrupting power by an external signal at an output part of photovoltaic units such as solar cell modules, it is possible to forcibly stop transmission of a power generation current at the time of an abnormality such as a fire, and to prevent a secondary disaster such as an electric shock accident.

BRIEF DESCRIPTION OF THE DRAWINGS

FIGS. 3A and 3B illustrate an example configuration of a solar cell module, in which
FIG. 3A is a crystalline silicon solar cell module and FIG. 3B is a compound semiconductor solar cell module.
FIGS. 7A and 7B illustrate a protection element, in which
FIG. 7A is a plan view and FIG. 7B is a cross-sectional view taken along the line A-A'.

FIGS. 9A and 9B illustrate a circuit diagram of a protection element, in which FIG. 9A shows a state before the protection element is activated and FIG. 9B shows a state after the protection element is activated.

FIGS. 14A to 14C are views showing a state of the protection element according to a modification before the activation, in which FIG. 14A is a plan view, FIG. 14B is a cross-sectional view taken along the line A-A', and FIG. 14C is a cross-sectional view.

FIGS. 15A to 15C are views showing a state in which the first soluble conductor of the protection element according to the modification is blown, in which FIG. 15A is a plan view, FIG. 15B is a circuit view, and FIG. 15C is a cross-sectional view.

FIGS. 16A to 16C are views showing a state in which the second soluble conductor of the protection element according to the modification is blown, in which FIG. 16A is a plan view, FIG. 16B is a circuit view, and FIG. 16C is a cross-sectional view.

MODE FOR CARRYING OUT THE INVENTION

Figure 1:
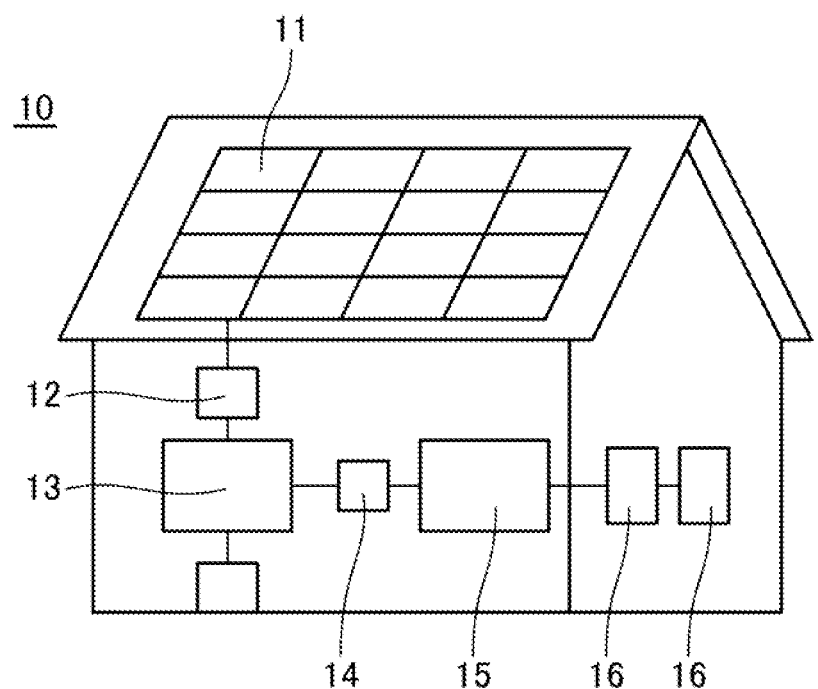
FIG. 1 illustrates an example configuration of a solar photovoltaic system.

Hereinafter, a protection circuit according to this technology will be described in detail with reference to the drawings. It should be noted that the present disclosure is not limited to the following embodiments and various modifications can be made without departing from the scope of the present technology. Moreover, the features illustrated in the drawings are shown schematically and are not intended to be drawn to scale. Actual dimensions should be determined in consideration of the following description. Furthermore, those skilled in the art will appreciate that dimensional relations and proportions may be different among the drawings in certain parts.

Protection Circuit 1

A protection circuit 1 is used in a power generation system, and is particularly preferably used in a solar photovoltaic system, wherein power transmission of a power generation current is forcibly stopped in the event of an abnormality such as a fire by interrupting a current path from a power generation part, thereby preventing a secondary disaster such as an electric shock accident and a fire. Hereinafter, a solar photovoltaic system will be described as an example of a power generation system using a protection circuit 1 according to the present disclosure.

Solar Photovoltaic System

As shown in FIG. 1, the solar photovoltaic system 10 includes, for example, a solar cell array 11, a junction box 12, a power conditioner 13, an earth leakage breaker 14, a distribution board 15, an electric watt-hour meter 16, and wirings for connecting the respective components.

Electrical output of mega solar power plants are literally several megawatts to several tens of megawatts, and that of residential solar photovoltaic systems are several kilowatts. The DC voltage generated by collecting the power generated by solar cells is 250 to 300 volts for residential solar photovoltaic system, compared to 600 to 1,000 volts for mega solar power plants.

Solar Cell Array

Figure 2:
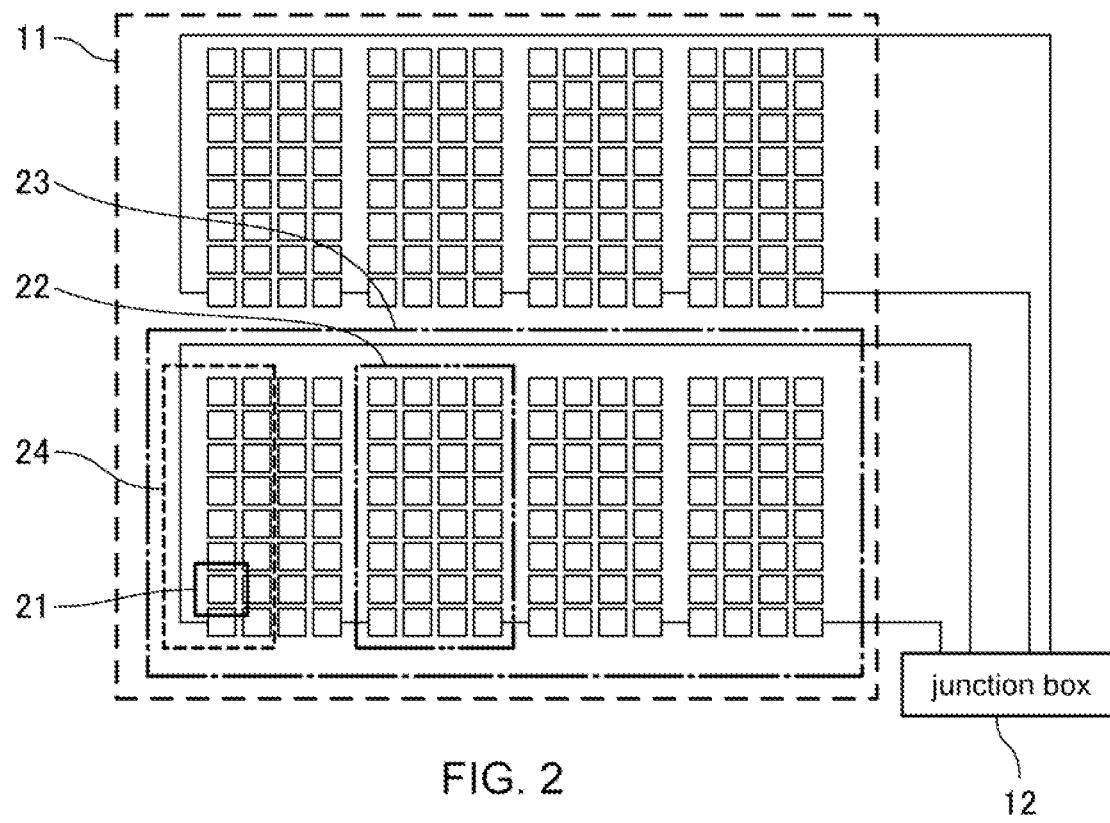
FIG. 2 illustrates an example configuration of a solar cell array.
Figure 4:
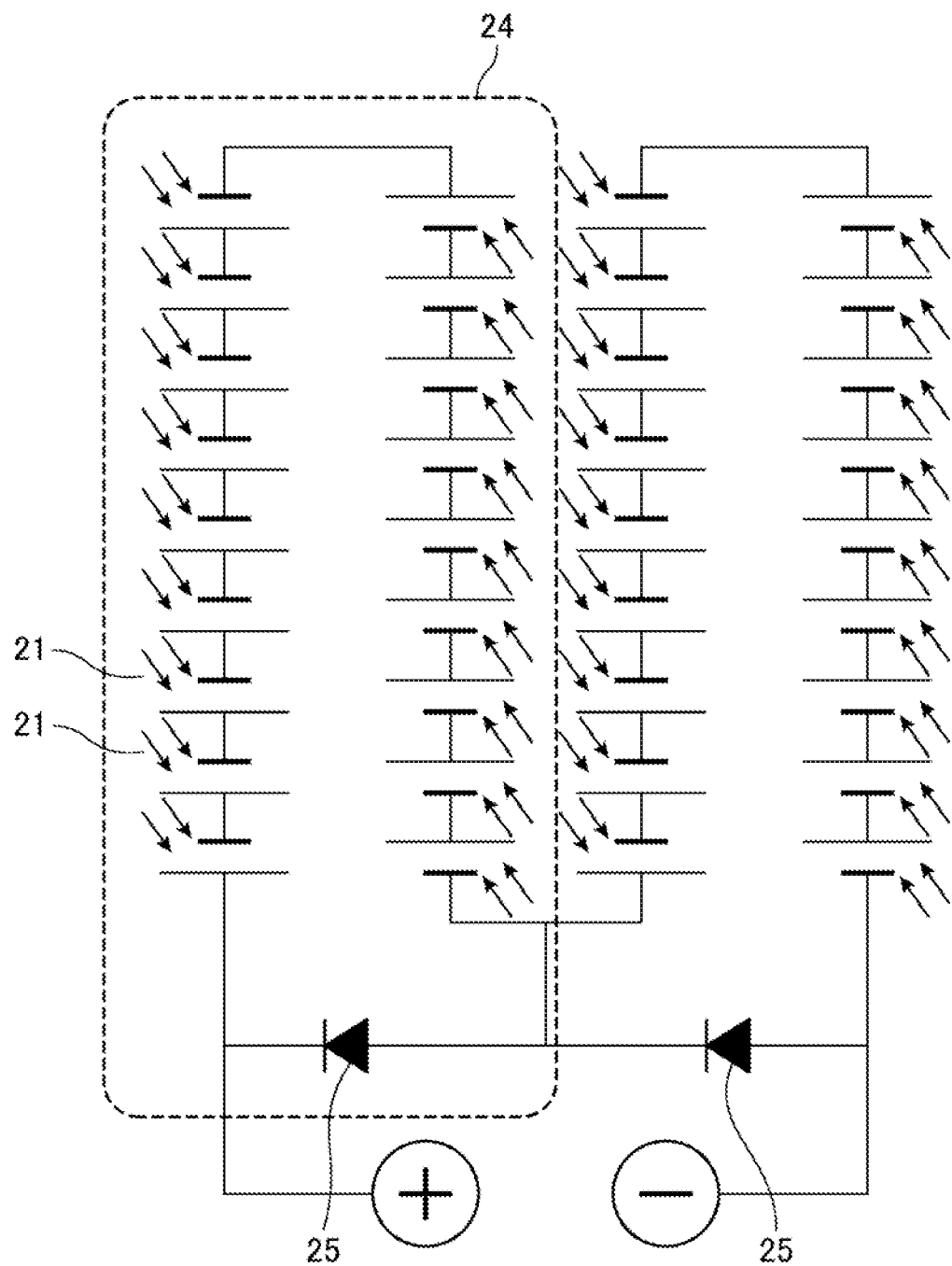
FIG. 4 is a circuit diagram showing an example of a circuit configuration of a solar cell module.

As shown in FIG. 2, a solar cell array 11 comprises a solar cell 21 that receives solar radiation or the like and converts light energy into electrical energy, a solar cell module 22 in which a plurality of the solar cells 21 are connected in series, and a string 23 in which a plurality of the solar cell modules 22 are connected in series. Normally, the solar cell module 22 constitutes one solar cell panel. The solar cell module 22 is divided into several clusters 24, and a bypass diode 25 is incorporated in each cluster 24 to prevent current from flowing into a defective solar cell 21 (FIG. 4).

In the present application, the solar cell 21, the solar cell module 22, the string 23, and the cluster 24, which constitute the solar cell array 11 to generate power by photoelectric conversion are collectively referred to as a photovoltaic units 26.

In the solar cell array 11, a plurality of strings 23 in which solar cell modules 22 are connected in series are arranged in parallel to obtain a predetermined voltage and a predetermined current. For example, in a residential solar photovoltaic system, a solar photovoltaic system with an output of about 250 to 300 W is constructed by using the solar cell modules 22 with a voltage of about 30V and a current of about 10 A.

The solar cell 21 may be of a crystalline silicon type, a thin film silicon type, and a compound semiconductor type, among other types, and is selected in consideration of manufacturing cost, power generation efficiency, wavelength characteristics, and thickness of the cell, among other factors. As examples of the structure of the solar cell 21, FIGS. 3A and 3B show a cross-sectional structure of a solar cell module 22A using a crystalline silicon solar cell 21A and a solar cell module 22B using a compound semiconductor solar cell 21B.

Figures 3A, 3B:
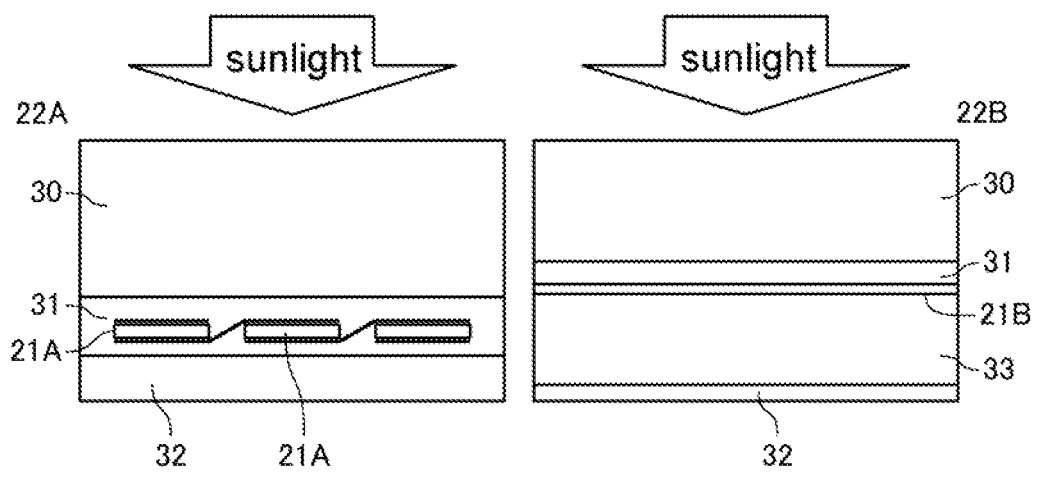

As shown in FIG. 3A, the crystalline silicon solar cell 21A is composed of a tempered glass 30 provided on a surface exposed to sunlight, a resin-made sealing material 31 for fixing the cell, and a weather-resistant back sheet 32 for protecting the back surface. As shown in FIG. 3B, the compound semiconductor solar cell 21B is composed of a tempered glass 30 provided on a surface exposed to sunlight, a resin-made sealing material 31, a substrate glass 33 on which a solar cell is deposited, and a back sheet 32 for protecting the back surface.

As the sealing material 31, EVA (ethylene-vinyl acetate copolymer) is generally used. As the back sheet 32, PVF (polyvinyl fluoride), PTFE (polytetrafluoroethylene), PET (polyethylene terephthalate), aluminum sheet or the like is generally used.

The junction box 12 incorporates connection terminals for combining the outputs of a plurality of strings 23 arranged in parallel and sending the combined output to the power conditioner 13 as the output of the solar cell array 11. In addition, the junction box 12 incorporates a blocking diode for preventing a current from flowing back from a string 23 having a high voltage to a string 23 having a low voltage, a switch for interrupting an electric path, and a lightning arrester as a countermeasure against lightning.

The power conditioner 13 controls the current and voltage supplied from the junction box 12 so as to achieve the maximum DC power, converts the DC power into AC power, and supplies the AC power to an outlet in a house or sells the power. In addition, a linkage protection device is incorporated so as not to adversely affect the commercial power network. The function of the junction box 12 may be incorporated in the power conditioner 13.

The earth leakage breaker 14 interrupts electric power when there is leakage from the electric power system. The distribution board 15 distributes electric power to electric equipment such as outlets, and has a breaker dedicated to the solar photovoltaic system 1.

The electric watt-hour meter 16 integrates the electric power sold to an electric power company and the electric power purchased from an electric power company. In addition, an external monitor for displaying the power generation status and the power sales status, a storage battery and a charging device for storing the generated power, and a pyranometer for monitoring solar radiation, among other devices, may be added.

Protection Circuit 1

Figure 5:
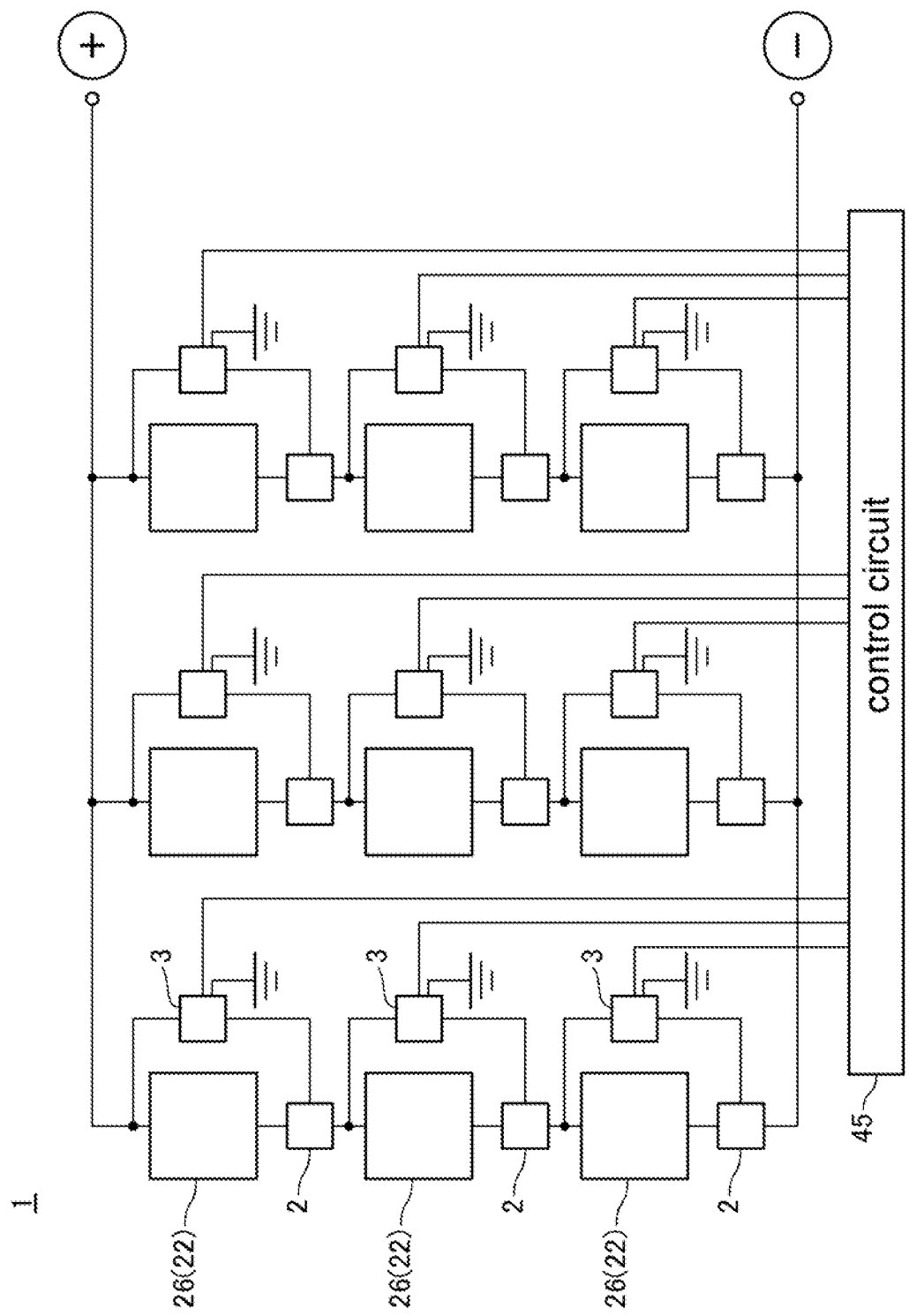
FIG. 5 illustrates a configuration example of a protection circuit.

FIG. 5 is a circuit diagram showing a protection circuit according to the present disclosure. As shown in FIG. 5, a protection circuit 1 according to the present disclosure includes a photovoltaic units 26, a protection element 2 provided on a current path of the photovoltaic units 26, and a switch 3 for activating the protection element 2. The protection circuit 1 activates the protection element 2 provided on the current path of the photovoltaic units 26 in response to the operation of the switch 3 to interrupt the current path of the photovoltaic units 26. As a result, the protection circuit 1 can forcibly stop the transmission of the current generated by the photovoltaic units 26 in the event of an abnormality such as a fire, thereby preventing a secondary disaster such as an electric shock accident.

The protection circuit 1 is provided with the protection element 2 on the current path of the photovoltaic units 26, and the protection element 2 are preferably provided between the solar cell modules 22 as shown in FIG. 5. As a result, the solar cell modules 22 are separated from each other, thereby preventing the plurality of solar cell modules 22 from being connected to each other to increase the power flowing to the power supply path. When the current path is interrupted, power is supplied from the solar cell module 22 to the protection element 2, but the voltage applied to each protection element 2 is the voltage generated by the solar cell module 22 (for example, around 30 V), so that the protection element 2 having the same level of rating as that of the solar cell module 22 can be used.

The protection circuit 1 may be provided intermittently between the plurality of solar cell modules 22 in a power supply path where the plurality of solar cell modules 22 are connected in series, or may be provided for each solar cell 21, each cluster 24, or each string 23. The interval between the protection elements 2 can be appropriately designed in accordance with an allowable amount of electric power flowing from the photovoltaic units 26 to the protection element 2 when the protection element 2 is activated, and the number and output of the solar cell modules 22 constituting the photovoltaic units 26, among other factors, and the protection element 2 may be provided for each of the plurality of photovoltaic units 26; for example, one protection element 2 may be provided for each of the two solar cell modules 22.

Figure 6:
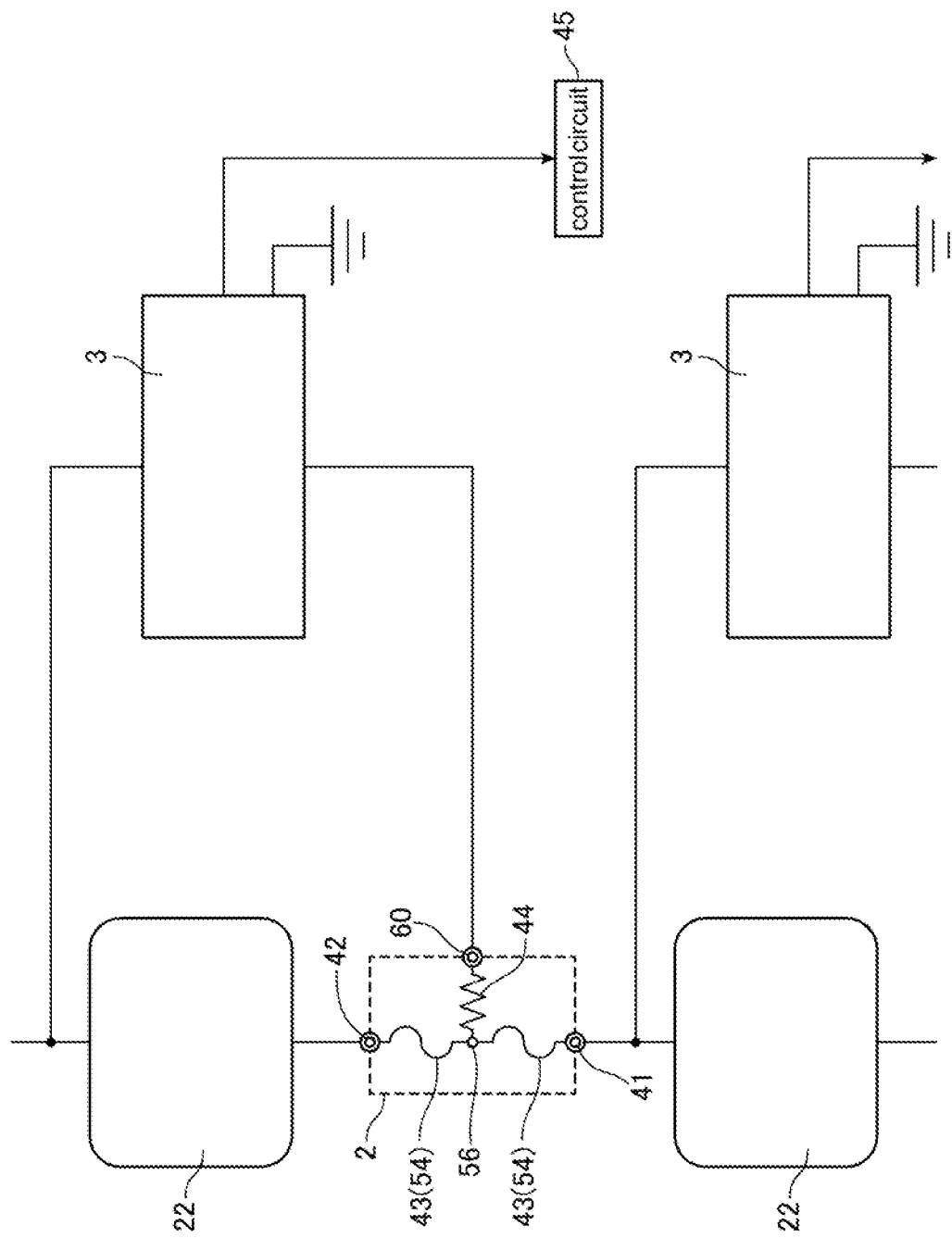
FIG. 6 illustrates a configuration example of a protection circuit.

In the following description, as shown in FIG. 5, the protection circuit 1 in which the protection element 2 is provided between each solar cell module 22 will be described as an example. As shown in FIG. 6, the protection element 2 includes first and second electrodes 41, 42 connected in series to a current path of the solar cell module 22, a fuse 43 connected between the first and second electrodes 41, 42, and a heat-generator 44 the conduction of which is controlled by a switch 3.

The heat-generator 44 blows the fuse 43 by heating by energization to interrupt the current path of the solar cell module 22; one end is connected to the current path between the solar cell modules 22 and the other end is connected to the switch 3.

The switch 3 is formed of, for example, an FET, is connected to a control circuit 45 that simultaneously interrupts the current paths of the photovoltaic units 26 in an emergency such as a fire, and is provided between the heat-generator 44 and the current path connecting the solar cell modules 22. The switch 3 stops energization to the heat-generator 44 of the electricity generated in the solar cell module 22 in a normal state, and energizes the heat-generator 44 by supplying electricity generated in the solar cell module 22 to the heat-generator 44 when receiving an interruption signal of the solar photovoltaic system 10 outputted from the control circuit 45.

The control circuit 45 is a circuit for centrally managing the interruption of the current paths of the solar photovoltaic system 10 and is operated in an emergency to switch the switch 3 so that the heat-generator 44 is energized. The control circuit 45 may be operated by an emergency stop operation, such as the operation of an emergency stop button of the solar photovoltaic system 10, or by remote operation via a network, or may be interlocked with a switch triggered by heat, smoke, seismic intensity, or the like.

Example of the Protection Element 2

Figure 7A:
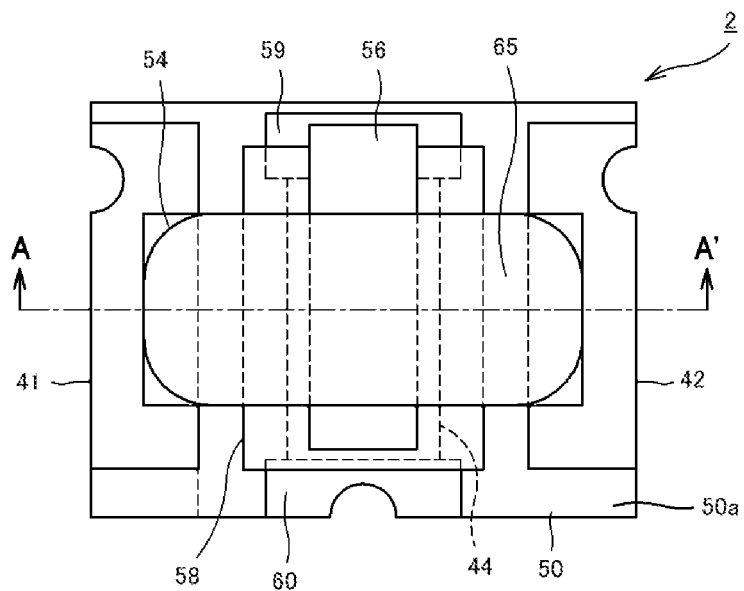

Next, a specific example of the protection element 2 will be described. As shown in FIG. 7, the protection element 2 includes: an insulating substrate 50; the first and second electrodes 41, 42 provided on the insulating substrate 50 and connected in series with a current path of the photovoltaic units 26; the heat-generator 44 which is provided on the insulating substrate 50 and the conduction of which is controlled by the switch 3; a heat-generator lead-out electrode 56 laminated on the insulating substrate 50 so as to overlap the heat-generator 44 and is electrically connected to the heat-generator 44; and a soluble conductor 54 (the fuse 43) having both ends connected to the first and second electrodes 41, 42, respectively, and a central portion connected to the heat-generator lead-out electrode 56. On the insulating substrate 50, a cover member (not shown) for protecting the inside of the protection element 2 is mounted. The protection element 2 can interrupt the current path of the photovoltaic units 26 by blowing the soluble conductor 54 by the heat generated by the heat-generator 44.

The insulating substrate 50 is formed into a rectangular shape by an insulating member such as alumina, glass ceramics, mullite, or zirconia, among others. Alternatively, the insulating substrate 50 may be made of a material used for a printed circuit board such as a glass epoxy substrate or a phenol substrate.

The first and second electrodes 41, 42 are formed on opposite ends of the insulating substrate 50. The first and second electrodes 41, 42 can be formed of a conductive pattern such as Ag or Cu wiring. The first and second electrodes 41, 42 are connected to a first and second external connection electrodes 41a, 42a formed on a back surface 50b of the insulating substrate 50 via castellation from a top surface 50a. In the protection element 2, the first and second external connection electrodes 41a, 42a formed on the back surface 50b are connected to connection electrodes formed on a circuit board on which the protection element 2 is mounted, whereby the protection element 2 is incorporated into a part of a current path formed on the circuit board.

The heat-generator 44 is a conductive member that generates heat when energized, and is made of, for example, nichrome, W, Mn, or Ru, among others, or a material containing these. The heat-generator 44 can be formed by, for example, forming a paste by mixing powder of these alloys, compositions, or compounds with a resin binder, patterning the paste on the insulating substrate 50 by using a screen printing technique, and baking the paste.

In the protection element 2, the heat-generator 44 is covered with an insulating member 58, and a heat-generator lead-out electrode 56 is formed so as to face the heat-generator 44 through the insulating member 58. The heat-generator lead-out electrode 56 is connected to the soluble conductor 54, whereby the heat-generator 44 overlaps the soluble conductor 54 via the insulating member 58 and the heat-generator lead-out electrode 56. The insulating member 58 is provided for protecting and insulating the heat-generator 44 to efficiently transmit the heat of the heat-generator 44 to the soluble conductor 54, and is made of, for example, a glass layer.

The heat-generator 44 may be formed inside the insulating member 58 laminated on the insulating substrate 50. The heat-generator 44 may be formed on the back surface 50b of the insulating substrate 50 opposite to the top surface 50a on which the first and second electrodes 41, 42 are formed, or may be formed adjacent to the first and second electrodes 41, 42 on the top surface 50a of the insulating substrate 50. The heat-generator 44 may be formed inside the insulating substrate 50.

Further, one end of the heat-generator 44 is connected to a first heat-generator electrode 59 and to the heat-generator lead-out electrode 56 via the first heat-generator electrode 59, and the other end is connected to a second heat-generator electrode 60. The heat-generator lead-out electrode 56 is connected to the first heat-generator electrode 59 formed on the top surface 50a of the insulating substrate 50 and connected to the heat-generator 44, and is laminated on the insulating member 58 facing the heat-generator 44 and connected to the soluble conductor 54. Thus, the heat-generator 44 is electrically connected to the soluble conductor 54 via the heat-generator lead-out electrode 56. It should be noted that the heat-generator lead-out electrode 56 is disposed opposite to the heat-generator 44 via the insulating member 58, whereby the soluble conductor 54 can be melted and the melted conductor can be easily aggregated.

The second heat-generator electrode 60 is formed on the top surface 50a of the insulating substrate 50, and is connected to a heat-generator feed electrode formed on the back surface 50b of the insulating substrate 50 via castellation.

In the protection element 2, a soluble conductor 54 is connected from the first electrode 41 to the second electrode 42 via the heat-generator lead-out electrode 56. The soluble conductor 54 is connected to the first and second electrodes 41, 42 and the heat-generator lead-out electrode 56 via a connecting material such as a connecting solder.

Figure 8:
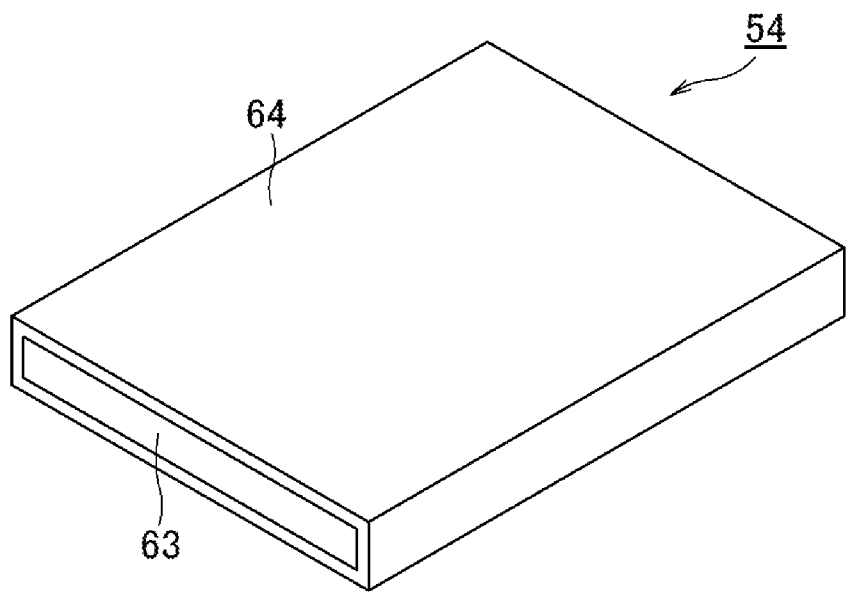
FIG. 8 is an external perspective view showing an example of a soluble conductor.

As shown in FIG. 8, the soluble conductor 54 is formed in a substantially rectangular plate shape having a total thickness of approximately 100 μm, for example, and is soldered to the first and second electrodes 41, 42 and the heat-generator lead-out electrode 56. The soluble conductor 54 has a low melting point metal layer 63 constituting an inner layer and a high melting point metal layer 64 having a melting point higher than that of the low melting point metal layer 63 and constituting an outer layer.

The low melting point metal layer 63 is preferably made of Sn or an alloy mainly composed of Sn, which is a material generally referred to as a Pb-free solder, or other low melting point metal. The melting point of the low melting point metal layer 2 is not necessarily higher than the temperature of the reflow furnace, and may be melted at about 200° C. The low melting point metal layer 2 may be made of Bi, In, or an alloy containing Bi or In, which melts at a lower temperature of about 120° C. to 140° C.

The high melting point metal layer 64 is preferably made of, for example, Ag, Cu, or an alloy mainly composed of Ag or Cu, and has a high melting point that does not melt even when the soluble conductor 54 is mounted on the insulating substrate 50 by a reflow furnace.

Figure 7B:
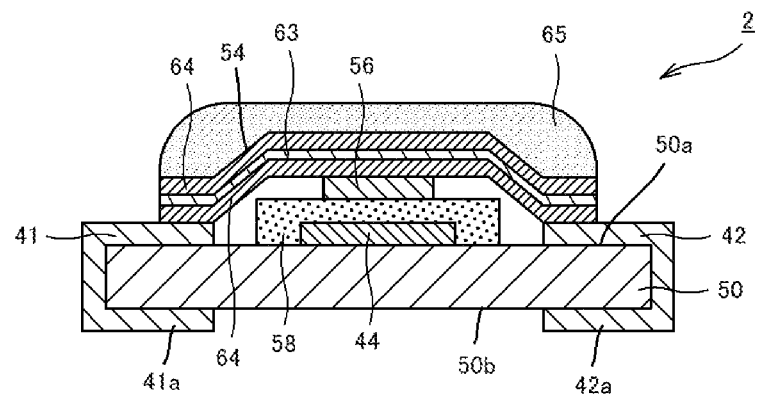

As shown in FIG. 7B, the soluble conductor 54 is mounted between the first and second electrodes 41, 42 provided on the insulating substrate 50 of the protection element 2, and then heated for reflow. Thus, the soluble conductor 54 is solder-connected to the first and second electrodes 41, 42 via a connecting solder.

Further, since the soluble conductor 54 is constituted by laminating the high melting point metal layer 64 of low resistance, the conductor resistance can be greatly reduced as compared with a soluble conductor using a conventional lead-based high melting point solder, and the current rating can be greatly improved as compared with a conventional chip fuse or the like of the same size. Further, the size of the fuse can be made smaller than that of a conventional chip fuse having the same current rating.

Further, since the soluble conductor 54 is provided with the low melting point metal layer 63 having a melting point lower than that of the high melting point metal layer 64, it is possible to start melting from the melting point of the low melting point metal layer 63 by heat generation due to energization of the heat-generator 44 and to blow the soluble conductor 54 promptly. For example, when the low melting point metal layer 63 is made of a Sn—Bi alloy or an In—Sn alloy, the soluble conductor 54 starts to melt at a low temperature of about 140° C. or 120° C. Then, the melted low melting point metal layer 63 erodes the high melting point metal layer 64 (solder erosion), thereby melting the high melting point metal layer 64 at a temperature lower than its own melting point. Therefore, the soluble conductor 54 can be more quickly blown by utilizing the erosion action of the high melting point metal layer 64 by the low melting point metal layer 63.

Flux

Further, in the protection element 2, in order to prevent oxidation of the high melting point metal layer 64 or the low melting point metal layer 63, to remove the oxide during blowout, and to improve the fluidity of the solder, the top surface or the back surface of the soluble conductor 54 may be coated with a flux 65. Coating with the flux 65 not only improves the wettability of the low melting point metal layer 2 (for example, solder) but also removes oxides generated while the low melting point metal is melted, and improves the blowout properties by the erosion action on the high melting point metal (for example, Ag) during actual use of the protection element 2.

Further, by coating the flux 65, even when an antioxidant film such as Pb-free solder mainly composed of Sn is formed on the surface of the outermost high melting point metal layer 64, oxides of the antioxidant film can be removed, oxidation of the high melting point metal layer 64 can be effectively prevented, and blowout properties can be maintained and improved.

It is preferable that the first and second electrodes 41, 42, the heat-generator lead-out electrodes 56, and the first and second heat-generator electrodes 59, 60 are formed by a conductive pattern such as Ag or Cu, and a protection layer such as Sn plating, Ni/Au plating, Ni/Pd plating, or Ni/Pd/Au plating is formed on the surface as appropriate. This prevents oxidation of the surface and suppress erosion of the first and second electrodes 41, 42 as well as the heat-generator lead-out electrode 56 caused by connecting material such as solder used to connect the soluble conductor 54.

Operation of the Protection Circuit

Circuit Diagram

Figures 9A, 9B:
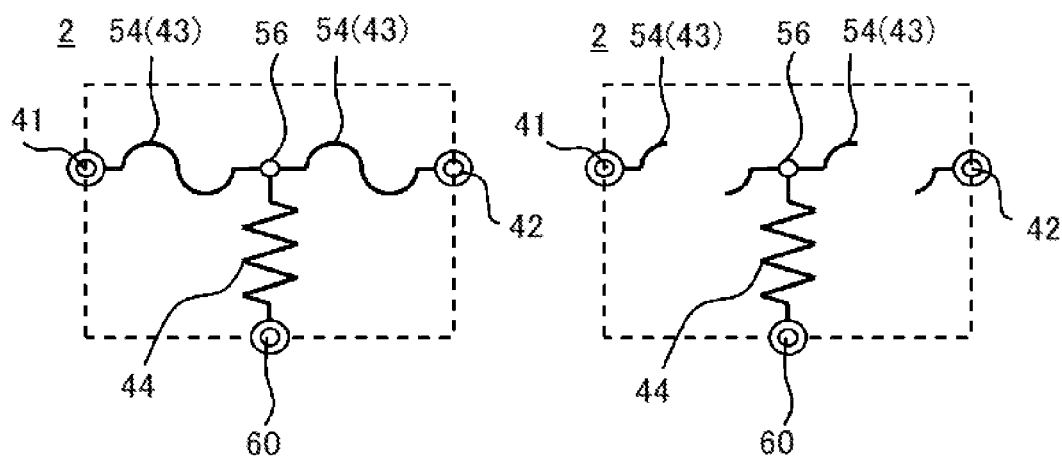

The protection element 2 according to the present technology has a circuit configuration as shown in FIG. 9. That is, the protection element 2 has a circuit configuration comprising the soluble conductor 54 (fuse 43) connected in series between the first and second electrodes 41, 42 via the heat-generator lead-out electrode 56, and the heat-generator 44 for melting the soluble conductor 54 by energizing and generating heat via a connection point of the soluble conductor 54. In the protection element 2, the first and second external connection electrodes 41a, 42a and heat-generator feed electrode respectively connected to the first and second electrodes 41, 42 and the second heat-generator electrode 60 are connected to the external circuit board. Thus, in the protection element 2, the soluble conductor 54 is connected in series on the current path of the solar cell module 22 via the first and second electrodes 41, 42, and the heat-generator 44 is connected to the switch 3 via the second heat-generator electrode 60.

Blowout Process

In the protection element 2 having such a circuit configuration, when it is necessary to interrupt the current path of the solar photovoltaic system 10, the heat-generator 44 is energized by the switch 3 provided in the external circuit.

In the protection circuit 1 in which the protection elements 2 are provided between the solar cell modules 22, as shown in FIG. 5, the second heat-generator electrode 60 of each protection element 2 is connected to the switch 3 via the heat-generator feed electrode. In the protection circuit 1 shown in FIG. 5, each switch 3 is connected to the control circuit 45, and the on/off of the switch 3 is integrally controlled by the control circuit 45, and each protection element 2 is deactivated in a normal state. When it is necessary to interrupt the current path of the solar cell module 22 due to a fire or other accidents, the control circuit 45 outputs an activation signal to each switch 3 in response to the operation of the emergency stop button or the like. Each switch 3 receives the activation signal of the control circuit 45, thereby enabling energization to the heat-generator 44.

Figure 10:
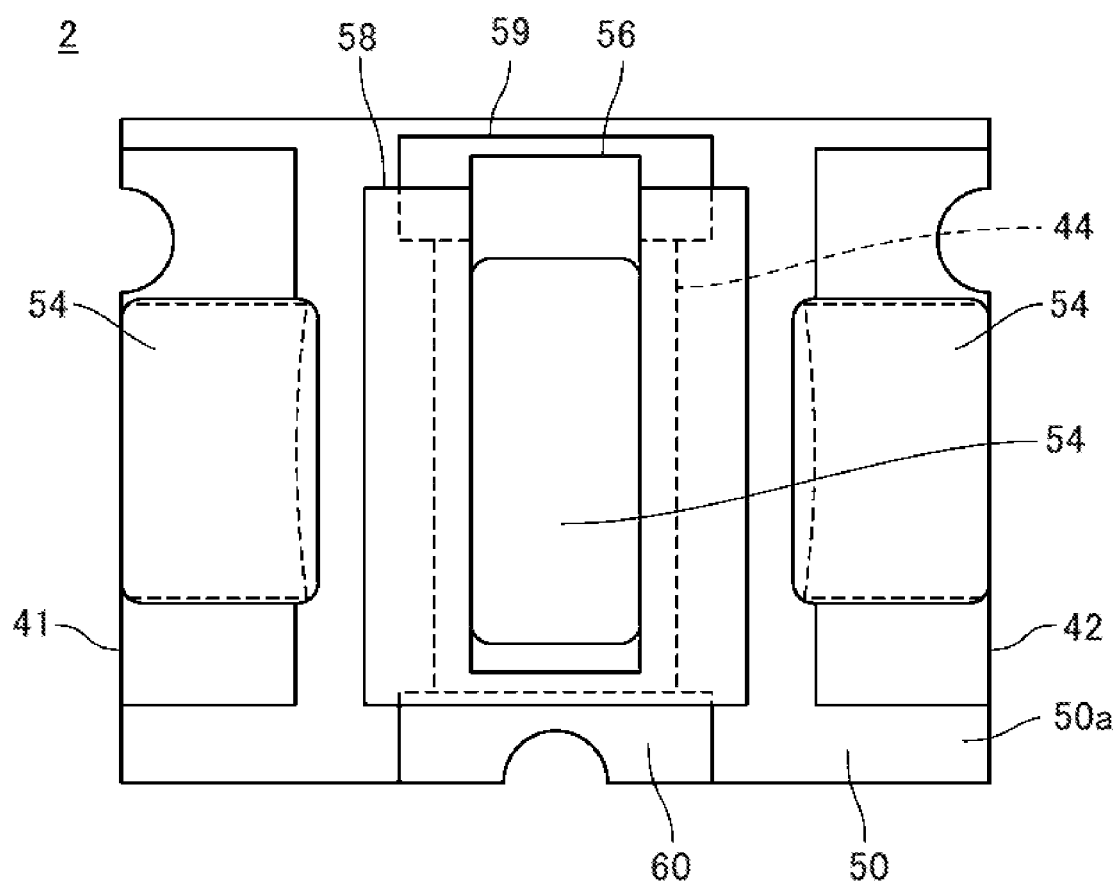
FIG. 10 is a plan view of a protection element after activation.

As a result, in the protection element 2, the soluble conductor 54 incorporated in the current path of the photovoltaic units 26 is melted by heat generated by the heat-generator 44, and as shown in FIG. 10, the melted conductor of the soluble conductor 54 is attracted to the heat-generator lead-out electrode 56 and the first and second electrodes 41, 42 having high wettability, whereby the soluble conductor 54 is blown. This ensures that the soluble conductor 54 is blown between the first electrode 41 and the heat-generator lead-out electrode 56 and between the heat-generator lead-out electrode 56 and the second electrode 42 (FIG. 9B), thereby interrupting the current path between the solar cell modules 22. In addition, when the soluble conductor 54 is blown, power supply to the heat-generator 44 is also stopped.

At this time, the soluble conductor 54 starts to melt from the melting point of the low melting point metal layer 63 having a melting point lower than that of the high melting point metal layer 64 by the heat generation of the heat-generator 44, and starts to erode the high melting point metal layer 64. Therefore, in the soluble conductor 54, by utilizing the erosion action of the high melting point metal layer 64 by the low melting point metal layer 63, the high melting point metal layer 64 is melted at a temperature lower than the melting temperature, and the current path of the solar cell module 22 can be promptly interrupted.

In the protection circuit 1 shown in FIG. 5, since the current path between the solar cell modules 22 is interrupted by activation of each protection element 2 provided between the solar cell modules 22, the power transmission of the solar cell modules 22 can be forcibly stopped, thereby preventing a secondary disaster such as an electric shock accident and a fire which might be otherwise caused by a large amount of power generated by a plurality of solar cell modules 22 having a voltage of about 30V and a current of about 10 A being connected in series or in parallel.

Further, since the protection circuit 1 irreversibly interrupts the current path by blowing the soluble conductor 54 of the protection element 2, the connection between the solar cell modules 22 is not restored and a large current does not flow even when the temperature after the fire extinguishing is lowered.

First Modification of Protection Circuit Relay Switch

In the protection circuit to which this technology is applied, the switch for activating the protection element 2 may be constituted by a relay switch. It should be noted that, in the following description, the same components as those of the protection circuit 1 and the protection element 2 are denoted by the same reference numerals and their details are omitted.

Figure 11:
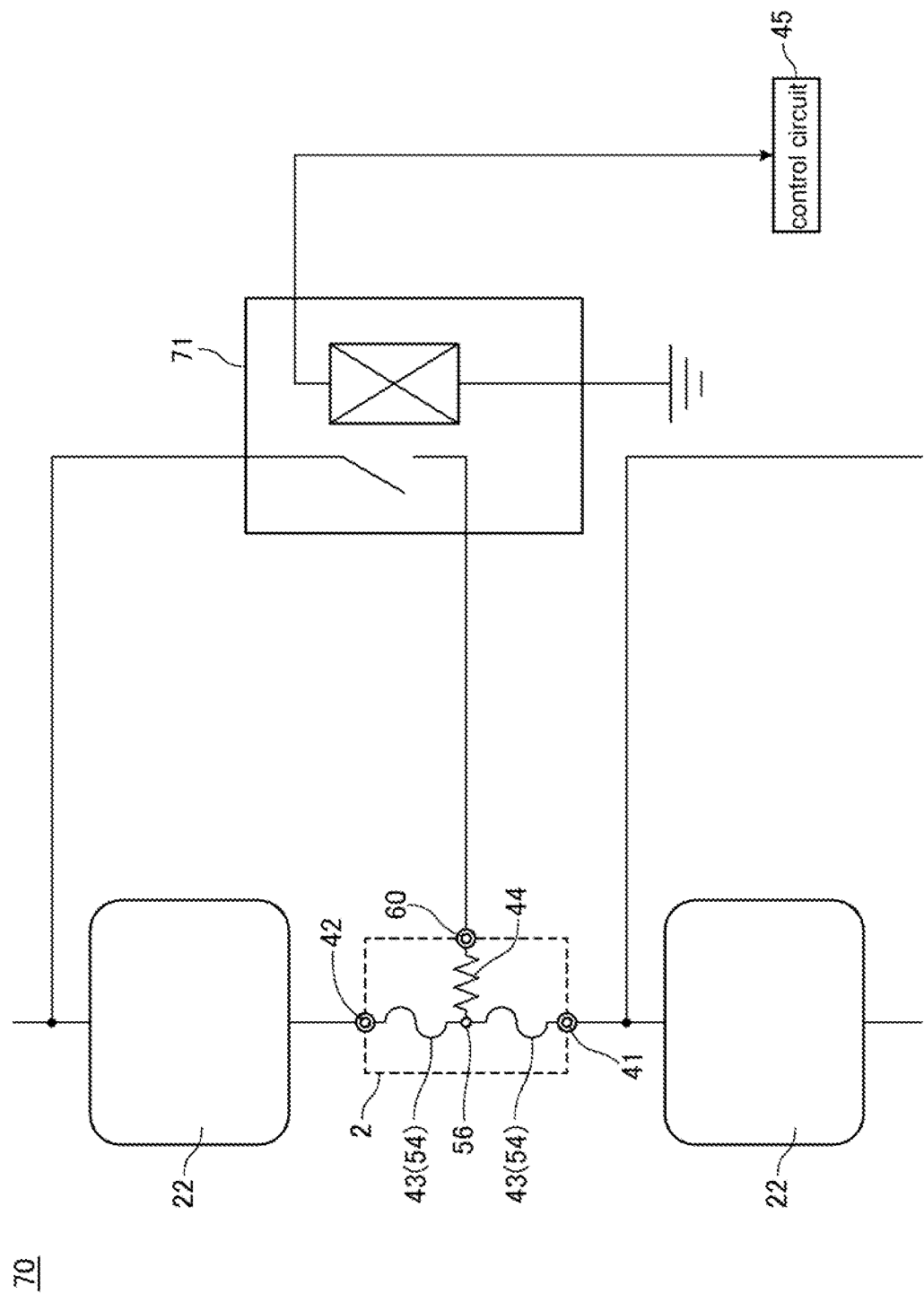
FIG. 11 is a diagram showing another configuration example of the protection circuit.

The protection circuit 70 shown in FIG. 11 has the same configuration as the protection circuit 1 except that a relay switch 71 is used as the switch. In the protection circuit 70, the heat-generator 44 of the protection element 2 is connected to a current path of the solar cell module 22 via the relay switch 71. The relay switch 71 has an output system which is switched between off and on, connected in parallel with the solar cell module 22, and connected to the heat-generator 44. The relay switch 71 also has an input system connected to the control circuit 45 for switching the output system. When the input system receives the activation signal from the control circuit 45, the relay switch 71 switches the output system so as to close the power supply path to the heat-generator 44.

Since the protection circuit 70 uses the relay switch 71 as a switch, the rated voltage of the input system from the control circuit 45 can be set separately from the voltage of the solar cell module 22. Therefore, the protection circuit 70 can be configured simply and inexpensively without using a device with a large rating.

Second Modification of Protection Circuit Electrical and Thermal Separation

The protection circuit according to the present technology may use, as a protection element for interrupting the current path of the solar cell module 22, a protection element having an activation path connected to the current path and having a soluble conductor, and a control path connected to a switch and having a heat-generator for blowing the soluble conductor, wherein the activation path and the control path are formed electrically independently. It should be noted that, in the following description, the same components as those of the protection circuit 1 and the protection element 2 are denoted by the same reference numerals and their details are omitted.

Figure 12:
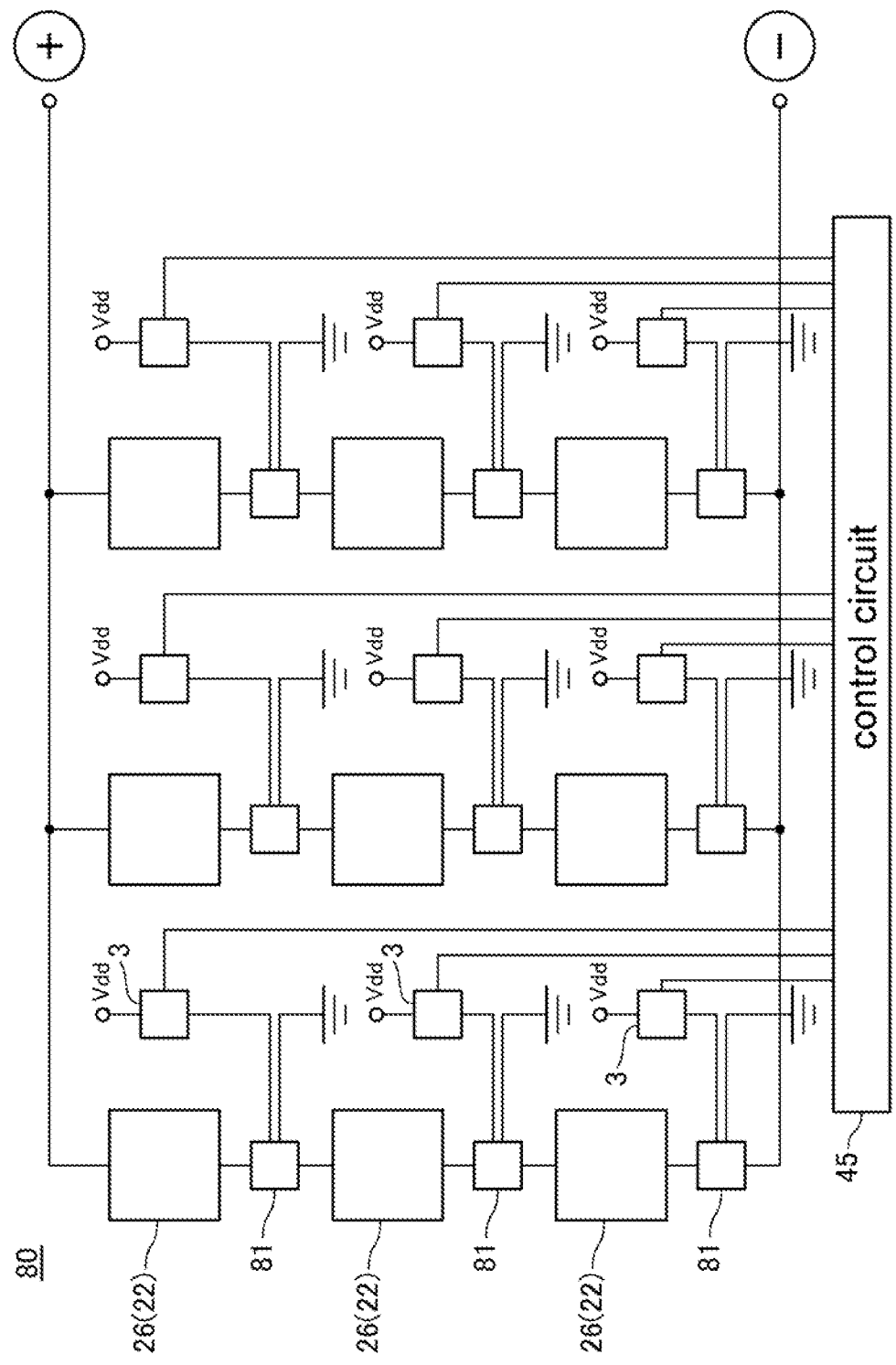
FIG. 12 is a diagram showing another configuration example of the protection circuit.
Figure 13:
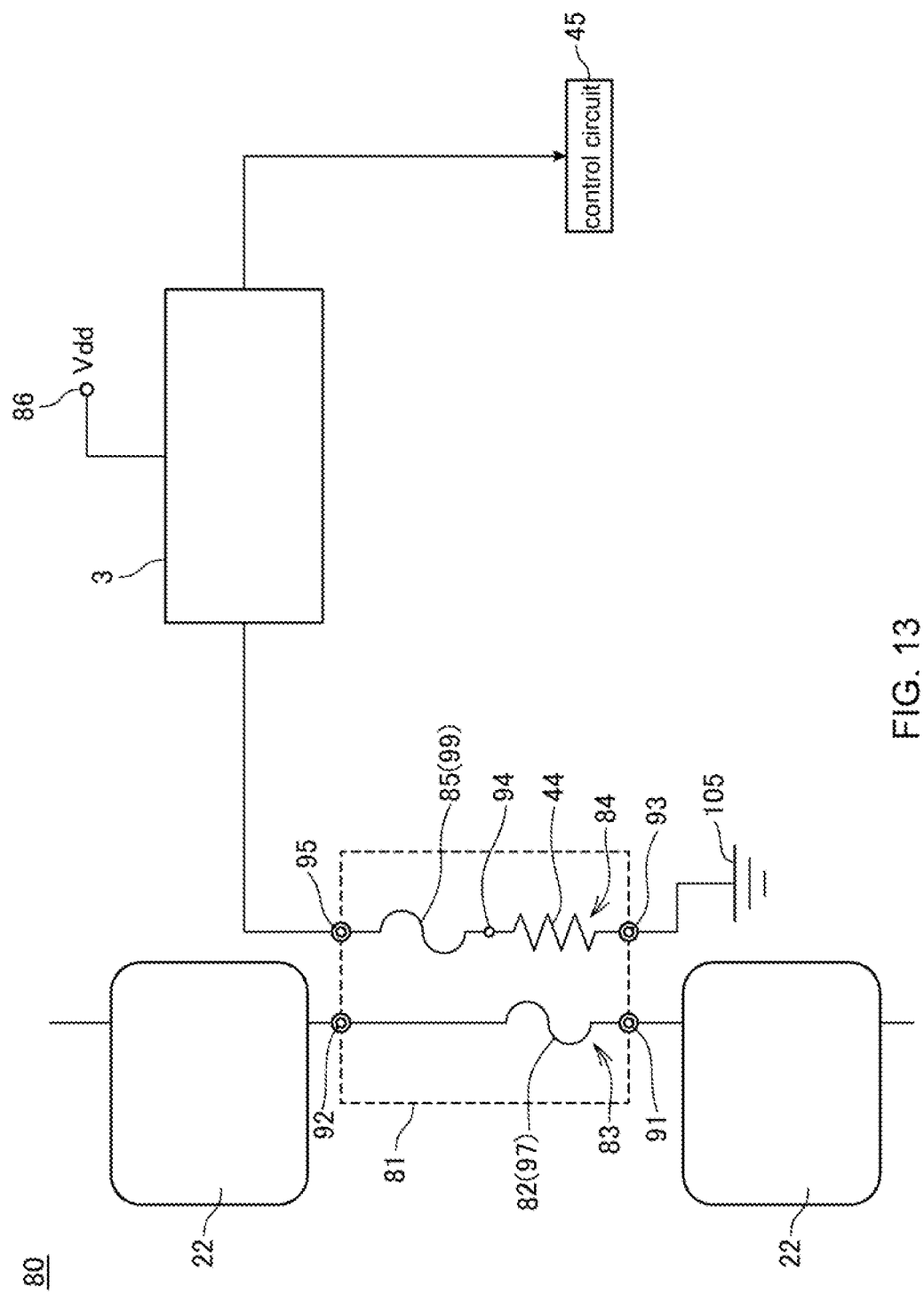
FIG. 13 is a view showing another configuration example of the protection circuit.

The protection circuit 80 shown in FIG. 12 includes a protection element 81 connected to the current path of the photovoltaic units 26, and a switch 3 for driving the protection element 81. As shown in FIG. 13, the protection element 81 includes an activation path 83 connected to the current path of the photovoltaic units 26 and having a first fuse 82 (first soluble conductor 97), and a control path 84 connected to the switch 3 and having a heat-generator 44 for blowing the first fuse 82. In the activation path 83, the first and second electrodes 91, 92 connected by the first fuse 82 are connected in series with the current path of the photovoltaic units 26. In the control path 84, one end of the heat-generator 44 is connected to an external power source 86 via the switch 3, and the other end of the heat-generator 44 is connected to a ground 105. It should be noted that, the control path 84 is provided with a second fuse 85, and after the first fuse 82 is blown by the heat of the heat-generator 44, the second fuse 85 is blown by the heat of the heat-generator 44, and power supply from the external power source 86 is stopped.

In the protection element 81, energization to the heat-generator 44 is controlled by the switch 3, the first fuse 82 is provided near the heat-generator 44, and when the heat-generator 44 is energized and generates heat, the first fuse 82 is blown and interrupted. That is, in the protection element 81, the activation path 83, and the control path 84 are electrically independent and thermally connected.

In the protection circuit 80 provided with the protection element 81, since the activation path 83 incorporated in the current path of the photovoltaic units 26 and the control path 84 for interrupting the activation path 83 are electrically independent, electric power can be supplied to the heat-generator 44 to achieve a heating amount sufficient to blow the first fuse 82 regardless of the rating of the photovoltaic units 26.

Protection Element 81

Next, a configuration example of the protection element 81 will be described. As shown in FIG. 14, the protection element 81 includes: an insulating substrate 90; a first electrode 91 and a second electrode 92 which are formed on an insulating substrate 90 and constitute an activation path 83; a third electrode 93, a fourth electrode 94, and a fifth electrode 95 which are formed on the insulating substrate 90 and constitute a control path 84; a first soluble conductor 97 (first fuse 82) which is mounted between the first and second electrodes 91, 92; a heat-generator 44 which is connected between the third and fourth electrodes 93, 94; and a second soluble conductor 99 (second fuse 85) which is mounted between the fourth and fifth electrodes 94, 95. FIG. 14A is a plan view of the protection element 81, FIG. 14B is a cross-sectional view taken along the line A-A', and FIG. 14C is a cross-sectional view.

The insulating substrate 90 can be formed of the same member as the insulating substrate 50 described above.

First and Second Electrodes: Activation Path

The first and second electrodes 91, 92 are formed on a top surface 90a of the insulating substrate 90 and laminated on an insulating member 101 described later. The first and second electrodes 91, 92 are connected to external connection terminals 91a, 92a formed on the back surface 90b of the insulating substrate 90 via through holes 100, and are connected to the current path of the photovoltaic units 26 via external connection terminals 91a, 92a.

The first and second electrodes 91, 92 are electrically connected by mounting a first soluble conductor 97 thereon. Thus, the protection element 81 is provided with an activation path 83 from the first electrode 91 through the first soluble conductor 97 to the second electrode 92, and the activation path 83 is incorporated into a portion of the current path of the solar cell module 22 formed on the circuit board on which the protection element 81 is mounted.

Heat-Generator

The heat-generator 44 is laminated on the top surface 90a of the insulating substrate 90 and covered with the insulating member 101. The heat-generator 44 has one end connected to the third electrode 93 and the other end connected to the fourth electrode 94.

The insulating member 101 is arranged so as to cover the heat-generator 44, and the first electrode 91, the second electrode 92, the fourth electrode 94, and the fifth electrode 95 are laminated so as to overlap the heat-generator 44 via the insulating member 101. As the insulating member 101, for example, glass can be used. It should be noted that, in the protection element 81, in order to efficiently transmit the heat of the heat-generator 44 to the first soluble conductor 97, an insulating member may also be laminated between the heat-generator 44 and the insulating substrate 90, and the heat-generator 44 may be provided inside the insulating member 101 formed on the surface of the insulating substrate 90.

Third to Fifth Electrodes: Control Path

The third electrode 93 is formed on the top surface 90a of the insulating substrate 90 and connected to one end of the heat-generator 44. The fourth electrode 94 is formed on the top surface 90a of the insulating substrate 90 to be connected to the other end of the heat-generator 44, and is laminated on the insulating member 101. The fifth electrode 95 is formed on the top surface 90a of the insulating member 90 and laminated on the insulating member 101. The third electrode 93 and the fifth electrode 95 are connected to the external connection terminals 93a, 95a formed on the back surface 90b of the insulating substrate 90 through a through hole 100. One end of the control path 84 is connected to the switch 3 via external connection terminals 93a, 95a, and the other end is connected to the ground 105.

The fourth and fifth electrodes 94, 95 are electrically connected by mounting the second soluble conductor 99 on the insulating member 101. Thus, the third to fifth electrodes 93 to 95 constitute a control path 84 that is electrically independent of the activation path 83. The control path 84 is a circuit for heating and blowing the first soluble conductor 97 of the activation path 83, and after blowing the first soluble conductor 97 to interrupt the activation path 83, the control path itself is also interrupted by blowing the second soluble conductor 99, thereby stopping power supply to the heat-generator 44.

Soluble Conductor

The first and second soluble conductors 97, 99 can be formed of the same material and structure as the aforementioned soluble conductor 54.

The first and second soluble conductors 97, 99 are connected onto the first and second electrodes 91, 92 and onto the fourth and fifth electrodes 94, 95 using solder or the like. It is preferable to form a silver-plated layer having good high-frequency characteristics as the outer layer of the first soluble conductor 97. Thus, the first soluble conductor 97 is reduced in resistance due to the skin effect to improve high-frequency characteristics, and even when a momentary large current flows, the current flows through the silver plating layer of the outer layer, thereby improving pulse resistance for preventing blowing due to self-heating.

Prior Melting of the First Soluble Conductor

Here, the protection element 81 is formed so that the first soluble conductor 97 of the activation path 83 melts prior to the second soluble conductor 99 of the control path 84. This is because, if the second soluble conductor 99 melts prior to the first soluble conductor 97, the power supply to the heat-generator 44 is stopped and the first soluble conductor 97 cannot be blown.

Therefore, the protection element 81 is formed so that the first soluble conductor 97 melts first when the heat-generator 44 generates heat. Specifically, the first soluble conductor 97 of the protection element 81 is mounted at a position closer to a heat generation center of the heat-generator 44 than the second soluble conductor 99.

Here, the heat generation center of the heat-generator 44 is a region having the highest temperature in the initial stage of heat generation in the heat distribution generated by the heat-generator 44. The heat generated by the heat-generator 44 has the largest amount of heat radiation from the insulating substrate 90, and when the insulating substrate 90 is formed of a ceramic material having excellent heat shock resistance and high thermal conductivity, the heat diffuses to the insulating substrate 90. Therefore, in the initial stage of heat generation when energization is started, the center farthest from the outer edge in contact with the insulating substrate 90 is the hottest, and the heat is radiated toward the outer edge in contact with the insulating substrate 90 and the temperature hardly rises in the outer region.

Therefore, in the protection element 81, the first soluble conductor 97 is disposed at a position closer to the center of heat generation having the highest temperature at the initial stage of heat generation of the heat-generator 44 than the second soluble conductor 99, so that the first soluble conductor 97 is heated and blown earlier than the second soluble conductor 99. Since the second soluble conductor 99 is heated later than the first soluble conductor 97, it is blown after the first soluble conductor 97 is blown.

In the protection element 81, the first soluble conductor 97 may be made to be blown earlier by changing the shapes of the first and second soluble conductors 97, 99. For example, since a smaller cross-sectional area facilitates the melting of the first and second soluble conductors 97, 99, the protection element 81 can blow the first soluble conductor 97 earlier than the second soluble conductor 99 by making the cross-sectional area of the first soluble conductor 97 smaller than that of the second soluble conductor 99.

Furthermore, in the protection element 81, the first soluble conductor 97 may be formed narrow and long along the current path between the first and second electrodes 91, 92, and the second soluble conductor 99 may be formed wide and short along the current path between the fourth and fifth electrodes 94, 95. Thus, the first soluble conductor 97 has a shape which is relatively easier to be blown than the second soluble conductor 99, and is blown prior to the second soluble conductor 99 by heat generation of the heat-generator 44.

Alternatively, in the protection element 81, the first soluble conductor 99 may be formed of a material having a melting point lower than that of the second soluble conductor 97. Thus, as with the above described implementations, the first soluble conductor 97 can be blown more easily than the second soluble conductor 99 by the heat generated by the heat-generator 44, and the first soluble conductor 97 can be reliably blown before the second soluble conductor 99.

Otherwise, the protection element 81 may be configured such that a difference is provided in the melting point by changing the layer structure of the first soluble conductor 97 and the second soluble conductor 99 so that the first soluble conductor 97 is blown relatively easily as compared with the second soluble conductor 99, and the first soluble conductor 97 is blown prior to the second soluble conductor 99 by the heat generated by the heat-generator 44.

Other Matters

In order to prevent oxidation of the first and second soluble conductors 97, 99 and to improve wettability of the first and second soluble conductors 97, 99 at the time of melting, a flux 102 is applied on the first and second soluble conductors 97, 99.

The inside of the protection element 81 is protected by covering the insulating substrate 90 with a cover member 103. As with the insulating substrate 90, the cover member 103 is formed of an insulating member such as a thermoplastic resin, ceramic, or glass epoxy substrate.

Circuit Configuration

In the protection circuit 80 in which the protection elements 81 are provided between the solar cell modules 22, as shown in FIG. 12, external connection terminals 95a of the protection elements 81 are respectively connected to the switches 3. Furthermore, in the protection circuit 80, each switch 3 is connected to the control circuit 45, and the on/off of the switch 3 is integrally controlled by the control circuit 45, and each protection element 81 is deactivated in a normal state. When it is necessary to interrupt the current path of the solar cell module 22 due to a fire or other accidents, the control circuit 45 outputs an activation signal to each switch 3 in response to the operation of the emergency stop button or the like. Each switch 3 receives the activation signal of the control circuit 45, thereby enabling energization to the heat-generator 44.

As a result, in the protection element 81, the first soluble conductor 97 incorporated in the current path of the solar cell module 22 is melted by the heat generated by the heat-generator 44, and as shown in FIG. 15, the melted conductor of the first soluble conductor 97 is attracted to the first and second electrodes 91, 92 having high wettability, so that the first soluble conductor 97 is blown. This ensures that the first soluble conductor 97 blows the activation path 83 between the first electrode 91 and the second electrode 92 (FIG. 15B) and interrupts the current path between the solar cell modules 22.

In addition, since the first soluble conductor 97 is blown prior to the second soluble conductor 99, the control path 84 can reliably supply power to the heat-generator 44 and generate heat until the activation path 83 is interrupted. The heat-generator 44 continues to generate heat even after the first soluble conductor 97 is blown, but the control path 84 is also interrupted by blowing the second soluble conductor 99 following the first soluble conductor 97 (FIGS. 16A, 16B, and 16C). As a result, the power supply to the heat-generator 44 is also stopped.

By using the protection circuit 80, since the activation path 83 incorporated in the current path of the photovoltaic units 26 and the control path 84 for interrupting the activation path 83 are electrically independent from each other, electric power can be supplied to the heat-generator 44 to achieve a heating amount sufficient to blow the first soluble conductor 97 regardless of the rating of the photovoltaic units 26. Therefore, in the protection circuit 80, the switch 3 for controlling the power supply to the heat-generator 44 can be selected according to the rating of the heat-generator 44 regardless of the rating of the activation path 83, and the control path 84 can be easily and inexpensively configured without using a device having a large rating.

DESCRIPTION OF REFERENCE CHARACTERS 1 protection circuit, 2 protection element, 3 switch, 10 solar photovoltaic system, 11 solar cell array, 12 junction box, 13 power conditioner, 14 earth leakage breaker, 15 distribution board, 16 electric watt-hour meter, 21 solar cell, 22 solar cell module, 23 string, 24 cluster, 25 bypass diode, 26 photovoltaic unit, 30 tempered glass, 31 sealing material, 32 back sheet, 33 substrate glass, 41 first electrode, 41a first external connection electrode, 42 second electrode, 42a second external connection electrode, 43 fuse, 44 heat-generator, 45 control circuit, 50 insulating substrate, 50a top surface, 50b back surface, 54 soluble conductor, 56 heat-generator lead-out electrode, 58 insulating member, 59 first heat-generator electrode, 60 second heat-generator electrode, 65 flux, 70 protection circuit, 71 relay switch, 80 protection circuit, 81 protection element, 82 first fuse, 83 activation path, 84 control path, 85 second fuse, 86 external power source, 90 insulating substrate, 90a top surface, 90b back surface, 91 first electrode, 92 second electrode, 93 third electrode, 94 fourth electrode, 95 fifth electrode, 97 first soluble conductor, 99 second soluble conductor, 100 through hole, 101 insulating member, 102 flux, 103 cover member, 105 ground

The invention claimed is:

1. A protection circuit comprising:
    a plurality of electrically connected photovoltaic units;
    a protection element provided on a current path between the plurality of photovoltaic units; and
    a switch for activating the protection element,
    wherein the protection element has a soluble conductor connected in series to a current path between the photovoltaic units, and a heat-generator a conduction of which is controlled by the switch,
    wherein the heat-generator and the switch are connected in series,
    wherein the heat-generator and the switch are connected in parallel with the soluble conductor and the current path between the photovoltaic units, and
    wherein the switch is operated to energize the heat-generator to interrupt the current path of the photovoltaic units.

2. The protection circuit according to claim 1, further comprising:
    a control circuit for controlling the switch,
    wherein the switch comprises an input system connected to the control circuit and an output system connected to the heat-generator, and
    wherein the switch is capable of separately setting a voltage of the input system and a voltage of the output system.

3. A protection circuit comprising:
    a plurality of electrically connected photovoltaic units;
    a protection element provided on a current path between the plurality of photovoltaic units; and
    a switch for activating the protection element,
    wherein the protection element has a soluble conductor connected in series to a current path between the photovoltaic units, and a heat-generator a conduction of which is controlled by the switch, and
    the protection circuit further comprising: an activation circuit including the soluble conductor connected to a current path between the photovoltaic units; and a control circuit including the heat-generator connected to the switch,
    the activation circuit and the control circuit being electrically independent.

4. The protection circuit according to claim 1, wherein the photovoltaic unit is one of a solar cell, a solar cell module, a cluster, and a string.

5. The protection circuit according to claim 1, wherein the protection element is provided for each of all or a plurality of the photovoltaic units.

6. The protection circuit according to claim 1, wherein the switch activates all the protection elements simultaneously.

7. The protection circuit according to claim 1, wherein the switch is activated in response to an interruption signal.

8. The protection circuit according to claim 7, wherein the interruption signal is output by smoke or temperature sensing due to fire or by an emergency stop operation.

9. The protection circuit according to claim 1,
    wherein the protection element has an insulating substrate, and
    wherein the heat-generator is provided on the insulating substrate.

10. The protection circuit according to claim 2,
    wherein the switch is a relay switch,
    wherein the output system of the relay switch that is switched between off and on is connected to the heat-generator, and is connected in parallel with the photovoltaic units, and
    wherein the input system for switching the output system is connected to the control circuit.

11. The protection circuit according to claim 3, wherein the photovoltaic unit is one of a solar cell, a solar cell module, a cluster, and a string.

12. The protection circuit according to claim 3, wherein the protection element is provided for each of all or a plurality of the photovoltaic units.

13. The protection circuit according to claim 3, wherein the switch activates all the protection elements simultaneously.

14. The protection circuit according to claim 3, wherein the switch is activated in response to an interruption signal.

15. The protection circuit according to claim 14, wherein the interruption signal is output by smoke or temperature sensing due to fire or by an emergency stop operation.

16. The protection circuit according to claim 3,
    wherein the protection element has an insulating substrate, and
    wherein the heat-generator is provided on the insulating substrate.

17. A power generation system, comprising:
    a plurality of electrically connected photovoltaic units;
    a protection element provided on a current path between the plurality of photovoltaic units; and
    a switch for activating the protection element,
    wherein the protection element has a soluble conductor connected in series to a current path between the photovoltaic units, and a heat-generator a conduction of which is controlled by the switch,
    wherein the heat-generator and the switch are connected in series,
    wherein the heat-generator and the switch are connected in parallel with the soluble conductor and the current path between the photovoltaic units, and
    wherein the switch is operated to energize the heat-generator to interrupt the current path of the photovoltaic units.

18. A power generation system according to claim 17, further comprising:
a control circuit for controlling the switch,
wherein the switch comprises an input system connected to the control circuit and an output system connected to the heat-generator, and
wherein the switch is capable of separately setting a voltage of the input system and a voltage of the output system.

19. A photovoltaic system comprising:
a plurality of electrically connected photovoltaic units;
a protection element provided on a current path between the plurality of photovoltaic units; and
a switch for activating the protection element,
wherein the protection element has a soluble conductor connected in series to a current path between the photovoltaic units, and a heat-generator a conduction of which is controlled by the switch,
the photovoltaic system further comprising: an activation circuit including the soluble conductor connected to a current path between the photovoltaic units; and a control circuit including the heat-generator connected to the switch, the activation circuit and the control circuit being electrically independent.

* * * * *